United States Patent [19]

Hanon et al.

[11] Patent Number: 5,964,564

[45] Date of Patent: Oct. 12, 1999

[54] METHOD AND APPARATUS FOR DETECTING CROSS-SLOTTED OBJECTS

[75] Inventors: Miles T. Hanon, Des Moines; David M. Kent, Edmonds, both of Wash.

[73] Assignee: B-W Controls, Inc., Seattle, Wash.

[21] Appl. No.: 08/680,391

[22] Filed: Jul. 15, 1996

[51] Int. Cl.[6] .................................................... G01V 9/04
[52] U.S. Cl. ........................ 414/417; 414/937; 414/935; 414/779; 414/811; 250/559.37
[58] Field of Search .................................... 209/916, 560, 209/632, 653; 414/416, 936, 274, 280, 935, 937, 811, 275, 273, 938, 417, 800, 810, 779; 269/58, 60; 250/61, 559.3, 559.33, 559.37, 559.36, 559.29

[56] References Cited

U.S. PATENT DOCUMENTS

| | | | |
|---|---|---|---|
| 4,803,373 | 2/1989 | Imamura et al. | 414/937 X |
| 5,194,743 | 3/1993 | Aoyama et al. | 250/559.33 X |
| 5,239,182 | 8/1993 | Tateyama et al. | 250/559.37 |
| 5,636,960 | 6/1997 | Hiroki et al. | 414/416 X |

FOREIGN PATENT DOCUMENTS

| | | | |
|---|---|---|---|
| 106641 | 5/1987 | Japan | 414/937 |
| 72137 | 4/1988 | Japan | 414/937 |
| 239864 | 9/1989 | Japan | 414/417 |
| 75362 | 3/1992 | Japan | 414/937 |
| 154144 | 5/1992 | Japan | 414/937 |
| 121523 | 5/1993 | Japan | 414/935 |
| 338737 | 12/1993 | Japan | 414/937 |

*Primary Examiner*—Frank E. Werner
*Attorney, Agent, or Firm*—Graybeal Jackson Haley LLP

[57] ABSTRACT

An apparatus for displacing and detecting cross-slotted objects includes a cradle mounted to a frame, the cradle being sized and shaped to hold a tray of objects in slots. As the cradle rotates on the frame, a displacing assembly is deployed at the rear of the tray with projections that contact cross-slotted objects and urge the cross-slotted objects to move at least partially out of the tray. Suitably positioned sensors detect the displaced cross-slotted objects for notification to a controller. A method for detecting cross-slotted objects includes first displacing the cross-slotted objects, and second, detecting the displaced cross-slotted objects.

18 Claims, 9 Drawing Sheets

METHOD AND APPARATUS FOR DETECTING CROSS-SLOTTED OBJECTS

TECHNICAL FIELD

The present invention pertains to the detection of cross-slotted objects, and, more particularly, to a method and apparatus for displacing cross-slotted objects and detecting the displaced cross-slotted objects.

BACKGROUND OF THE INVENTION

The present invention was developed to improve the manufacture of semiconductors. The semiconductors are formed from "wafers" that are substantially planar-shaped fragile objects. These wafers are retained in slotted trays during the semiconductor manufacturing process. Because the wafers are constructed of thin, brittle, and expensive material, they must be carefully handled and stored.

One method for storing such objects is to place them in a tray having a plurality of slots that are sized and shaped to receive the planar-shaped objects. The slots are evenly separated by spaces to permit a robotic arm to insert the objects in the tray and remove them therefrom. The tray has a first opening sized and shaped to permit the objects to be inserted into and removed from the slots in the tray. One recurring problem is the misplacement of the objects in the tray such that one side of the object is received in one slot and the other side of the object is received in an unmatching slot, resulting in a "cross-slotted" condition. In this condition, the object is disposed across one or more spaces separating the slots.

When cross-slotting occurs, the attempt to insert additional objects into a slot occupied by a cross-slotted object will result in breakage of one or both of the objects. This is undesirable because not only are valuable objects destroyed, but the manufacturing process must slow down or come to a halt while the broken debris is removed and the cause of the cross-slotting remedied.

Another recurring problem is the tendency of objects received in the trays to slide at least partially and sometimes entirely out of the slots. Again, this can result in breakage and a resulting slowdown in the manufacturing process.

Hence, there is a need for a method and apparatus that maintains the objects in the slots during the manufacturing process and that detects and prevents cross-slotting of objects before breakage occurs. Ideally, the detection of cross-slotted objects will include notification to a controller for immediate remedial action, which will result in preventing the unnecessary breakage of objects and interference with the manufacturing process. "Controller" as used herein includes human operators as well as electronic and robotic devices that control the insertion and removal of objects in the tray.

SUMMARY OF THE INVENTION

The apparatus formed in accordance with the present invention is designed for use in displacing cross-slotted objects in a tray, the tray having a plurality of slots separated by spaces, each slot sized and shaped to receive a substantially planar-shaped object, the tray further including a first opening sized to allow insertion of the objects into the slots and removal of the objects therefrom, and a second opening sized and shaped to permit access to the spaces between the slots, the apparatus having a tray support; a displacing mechanism for displacing one or more cross-slotted objects in the tray, the displacing mechanism comprising at least one projection sized and shaped to be at least partially inserted into the spaces between the slots; and a prime mover for moving the displacing mechanism into and out of the spaces between the slots whereby the displacing mechanism pushes the cross-slotted objects disposed in the spaces between the slots at least partially out of the tray through the first opening.

In accordance with another aspect of the present invention, the displacing mechanism comprises a plurality of projections, each projection being aligned with a single space between a pair of slots in the tray.

In accordance with a further aspect of the present invention, the apparatus includes a device for tilting the tray between a substantially horizontal position and an inclined position. Ideally, the prime mover cooperates with the tray support such that the displacing mechanism displaces cross-slotted objects as the tray is tilted from the inclined position to the horizontal position.

In accordance with a further embodiment of the present invention, an apparatus for detecting cross-slotted objects in a tray is provided, the tray having a plurality of slots separated by spaces, each slot being sized and shaped to slidably receive a substantially planar-shaped object, the tray further including a first opening sized and shaped to allow insertion of objects into the slots and removal of objects therefrom, and a second opening sized and shaped to permit access to each space between each pair of slots, the apparatus comprising: a tray support, a mechanism for displacing cross-slotted objects in the tray, comprising at least one projection sized and shaped to be at least partially inserted into the space between each pair of slots; a device for moving the displacing mechanism into the space between each pair of slots to push cross-slotted objects disposed in the space between the pair of slots at least partially out of the tray through the first opening; and a sensor for detecting the displaced cross-slotted objects.

In accordance with another aspect of the present invention, the displacing mechanism comprises a plurality of projections positioned adjacent to the second opening in the tray when the tray is supported on the support, and further wherein each projection is aligned with a space between a pair of slots.

In accordance with yet another aspect of the present invention, the apparatus further comprises means for notifying the controller of displaced cross-slotted objects, and mechanism for tilting the support to thereby tilt the tray between a substantially horizontal position and an inclined position. Furthermore, the moving device cooperates with the support for moving the displacing mechanism as the tilting mechanism moves the tray support.

In accordance with yet a further embodiment of the present invention, there is provided an apparatus for detecting cross-slotted objects in a tray, the tray having a plurality of slots for receiving objects, each pair of slots being separated by a space, the tray including a first opening sized and shaped to allow insertion of object into the slots and removal therefrom by a controller, and a second opening sized and shaped to enable access to each of the spaces between the slots, the apparatus comprising a cradle for holding the tray; a tilting mechanism for tilting the cradle from a substantially horizontal position to an inclined position; a displacing mechanism for displacing cross-slotted objects at least partially out of the first opening in the tray as the tilting mechanism tilts the cradle and the tray to the inclined position; and a detector for detecting displaced cross-slotted objects.

In accordance with yet another aspect of the present invention, the cross-slotted object detector further comprises means for notifying the controller of the displaced cross-slotted objects. The apparatus may further include a base member upon which the cradle is rotatably mounted; and further wherein the displacing mechanism is mounted on the cradle to be positioned adjacent the second opening in the tray when the tray is being held by the cradle, the displacing mechanism cooperating with the base member as the tilting mechanism tilts the cradle. Additionally, a cam member is mounted on the base and positioned such that the displacing mechanism contacts the cam member as the tilting mechanism tilts the cradle.

In accordance with a method for detecting cross-slotted objects in a tray, the method comprises the steps of: displacing cross-slotted objects at least partially out of the tray; and electronically detecting the displaced cross-slotted objects. The method may further include the step of notifying a controller of the detected displaced cross-slotted objects.

Alternatively, the method for detecting cross-slotted objects in a tray comprises tilting the tray from an inclined position to a horizontal position; mechanically displacing cross-slotted objects to project at least partially out of the tray as the tray is tilted to the horizontal position; and electronically detecting the displaced cross-slotted objects in the tray.

As will be readily appreciated from the foregoing, the present invention provides a simple, efficient, mechanical process for maintaining objects, such as silicone wafers, in a slotted tray and for detecting and displacing cross-slotted objects in the tray. The apparatus formed in accordance with the present invention and the accompanying method will result in substantial cost savings, especially in the manufacture of semiconductor chips. Furthermore, the present invention will not require substantial modification of existing manufacturing equipment because of its efficient use of space and compact size.

BRIEF DESCRIPTION OF THE DRAWINGS

The foregoing features and other advantages of the present invention will be more readily appreciated as the same become better understood from the following detailed description when taken in conjunction with the accompanying drawings, wherein.

DETAILED DESCRIPTION

Figure 1A:
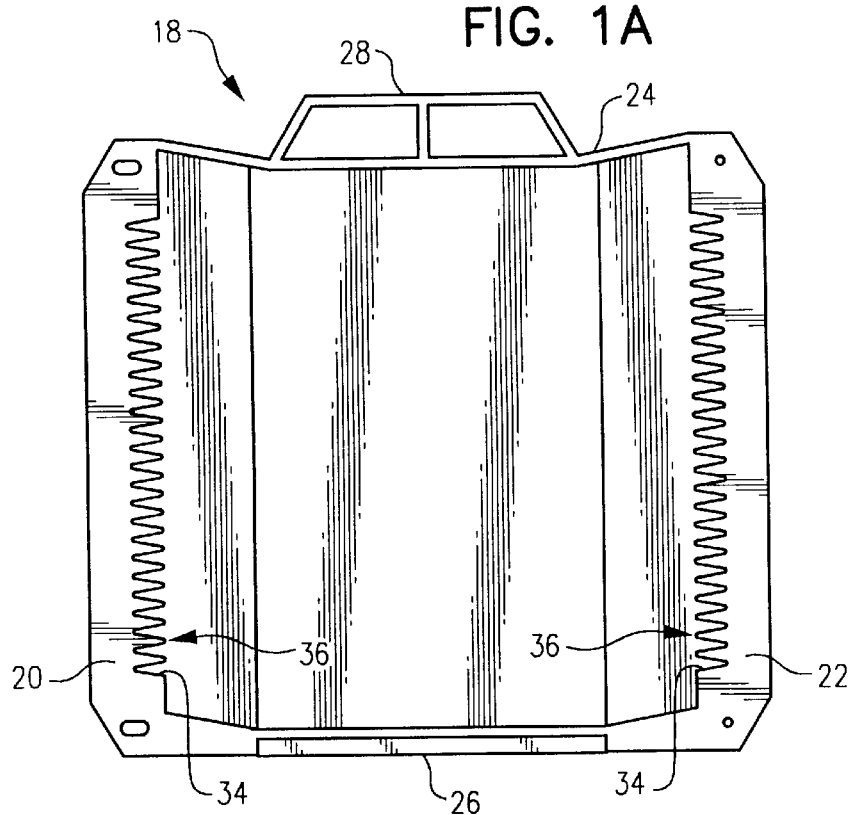
FIGS. 1A–C are top, side, and front plan views, respectively, of a wafer cassette tray.

The apparatus 10 for displacing and detecting cross-slottedobjects 12 will be described in conjunction with FIGS. 2–8. The apparatus 10 comprises a cradle 14 rotatable mounted on a frame 16. The cradle 14 is sized and shaped to support a tray 18 of objects 12 during a manufacturing process.

Figure 1B:
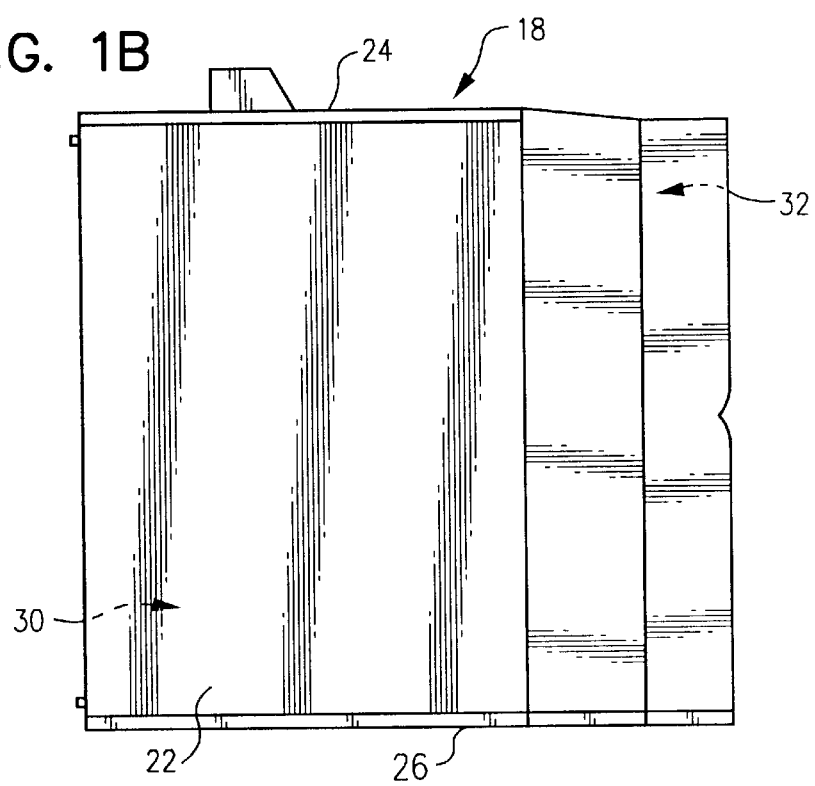
Figure 1C:
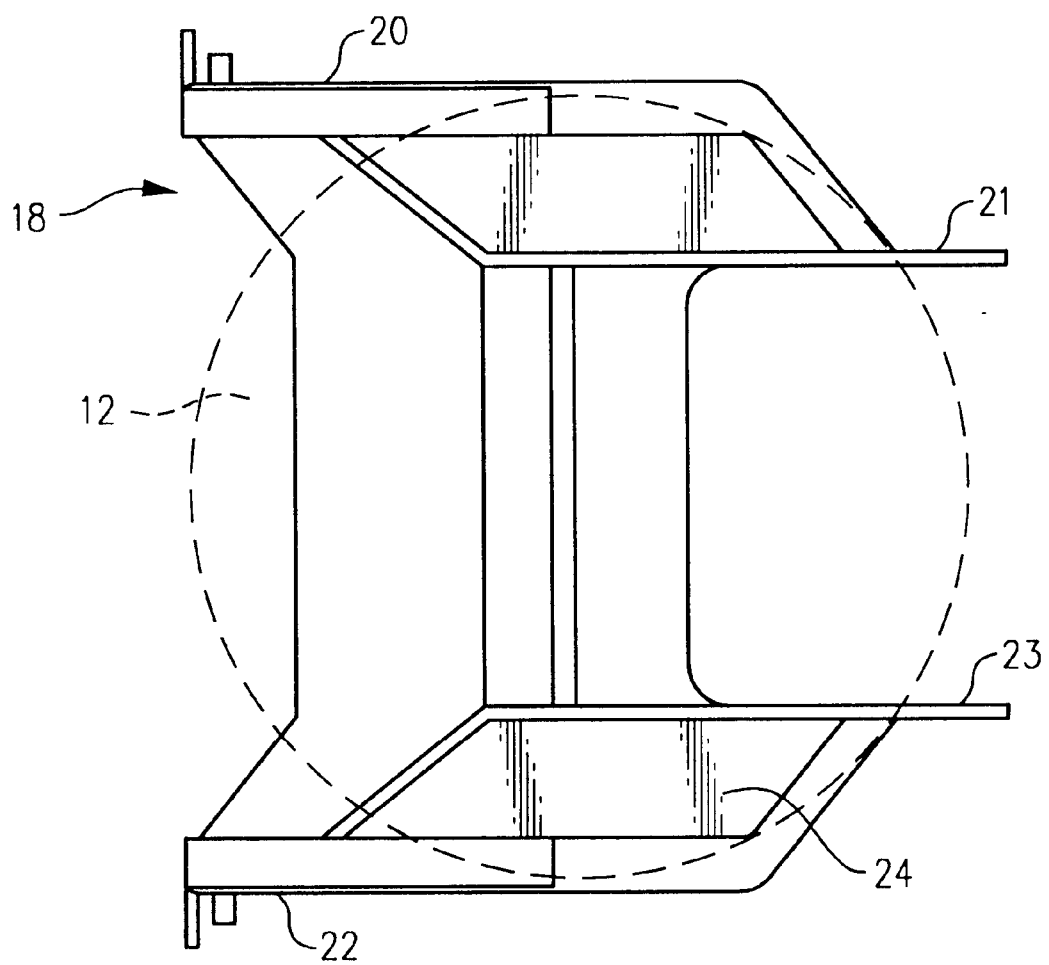
Figure 2:
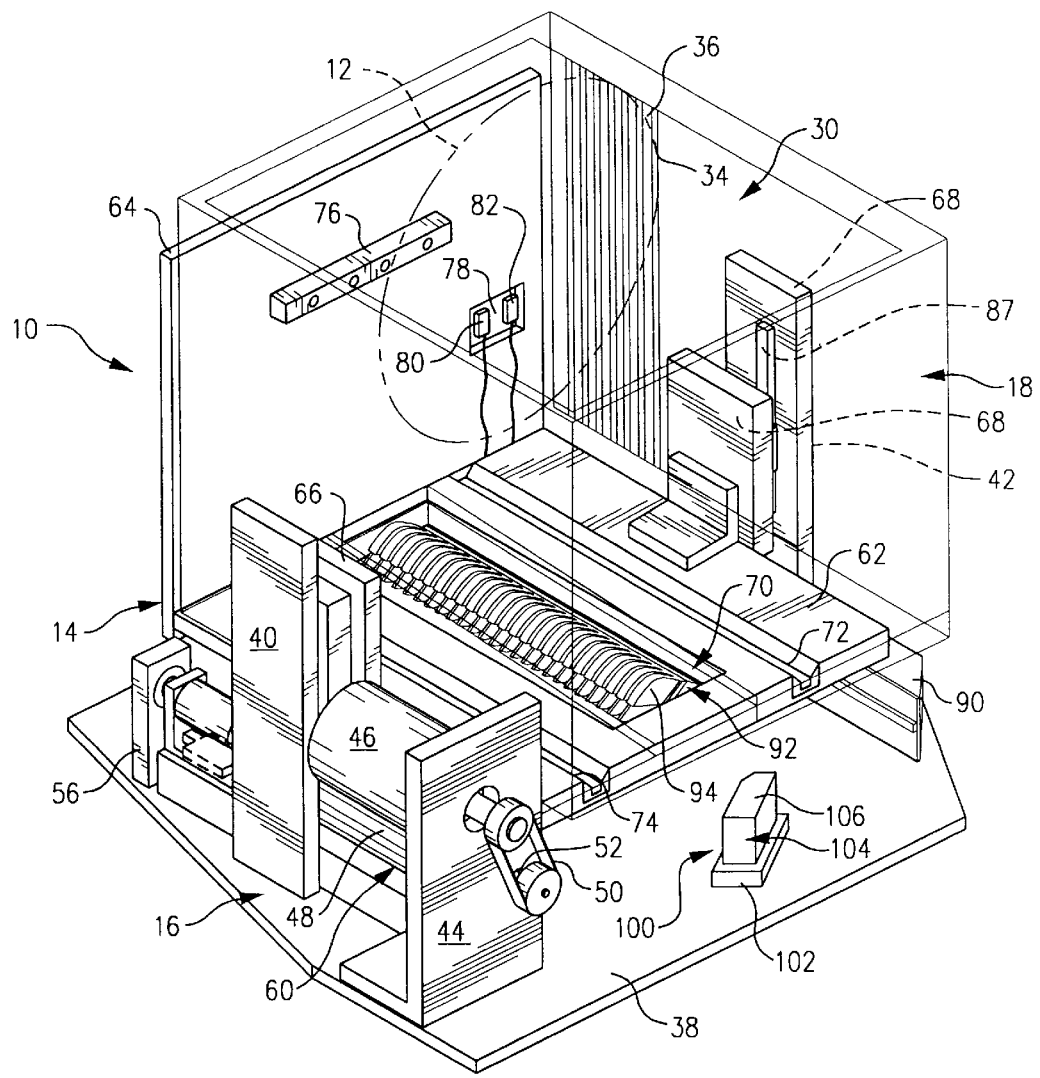
FIG. 2 is an isometric projection of the apparatus formed in accordance with the present invention wherein the cradle is shown in a fully tilted back or vertical position.
Figure 3:
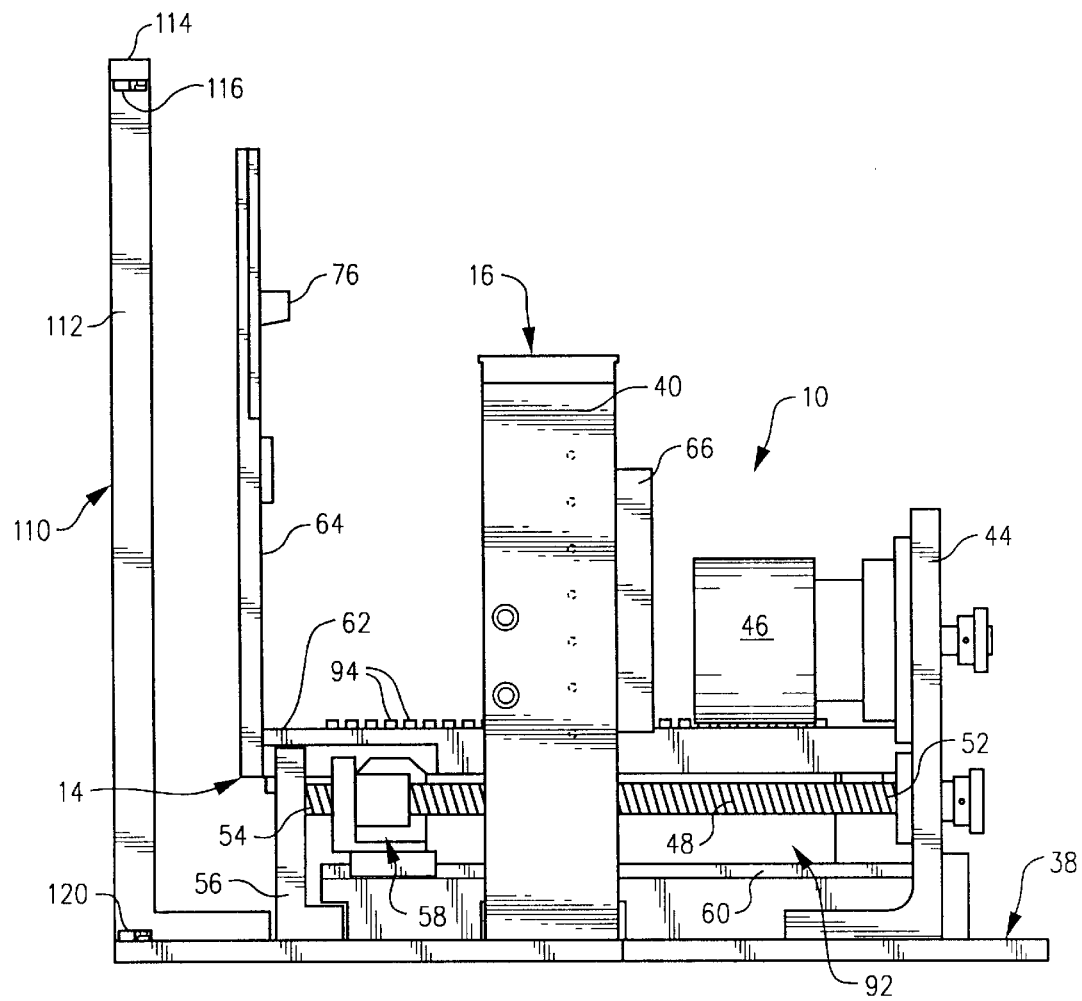
FIG. 3 is a side plan view of the apparatus of FIG. 1.
Figure 4:
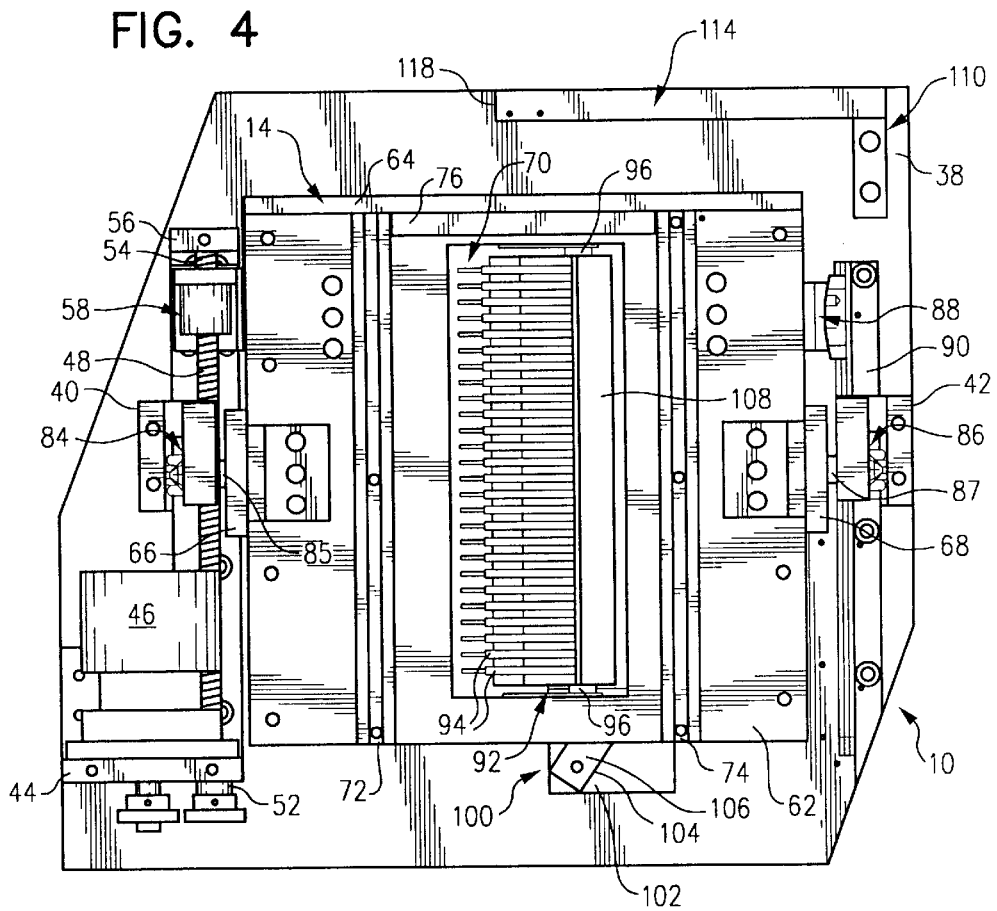
FIG. 4 is a top plan view of the apparatus of FIG. 1.

The tray 18 is known in the art, and will be described briefly herein in connection with FIGS. 1A–1C. The tray 18 includes a pair of sidewalls 20 and 22 with rearward projecting legs 21 and 23 that are held in spaced parallel relationship by a top wall 24 and bottom wall 26. A handle 28 projects from the top wall 24. As shown in the top view in FIG. 1C, the sidewalls 20 and 22 define a large first opening 30 in the front of the tray 18 and a smaller second opening 32 at the back of the tray. The sidewalls 22 and 24 includes slots 34 for holding substantially planar-shaped objects 12 (as shown in FIG. 2). Each pair of slots 34 in the sidewalls 22 and 24 are separated by a space 36 formed between the slots 34.

The first opening 30 is sized and shaped to permit objects 12 to be inserted into the slots 34 and removed therefrom. The second opening 32 is positioned opposite the first opening 30 to permit access to the slots 34 and spaces 36 from the rear of the tray 18. However, the second opening 32 is narrower than the first opening 30 so that the objects 12 are retained in the slots 34 and are not allowed to exit the back of the tray 18.

Turning next to the apparatus 10, the frame 16 comprises a base 38 upon which are mounted upright cradle supports 40 and 42 and a motor support 44. A motor 46 is mounted to the motor support 44 and connected to a ball screw 48 via a drive belt 50. The ball screw 48 has a first end 52 supported in the motor support 44 and a second end 54 held in position by a ball screw support 56 attached to the base 38.

A carriage 58 is mounted to the ball screw 48 to move between the first end 52 and second end 54 of the ball screw 48. The carriage 58 is rotatably coupled to the cradle 14 such that as the ball screw 48 rotates about its longitudinal axis, the carriage 58 moves along the ball screw 48 and in turn causes the cradle 14 to tilt back from the untilted forward position (shown in FIG. 8) to the tilted back position (shown in FIGS. 2–5). The carriage assembly 58 rides along a track assembly 60 that is attached to the base 38.

The cradle 14 has a back wall 62 with a forward wall 64 depending substantially perpendicularly therefrom at one side. Side brackets 66 and 68 are mounted to the back wall 62, one on each side of the back wall 62, to project substantially perpendicularly therefrom. The side brackets 66 and 68 are slidably and rotatably coupled to the upright cradle supports 40 and 42 respectively, by coupling assemblies 84 and 86. More particularly, the coupling assemblies are attached to the side brackets 66 and 68 to rotate about a horizontal axis, and they are mounted on a track 85 and 87 on the upright cradle supports 40 and 42 to slidably travel in a vertical direction simultaneously as they rotates.

The back wall 62 of the cradle 14 has an opening 70 formed therein to allow access to the rear of the tray 18 as it is supported in the cradle 14. A pair of channels 72 and 74 are similarly formed in the back wall 62. These channels 72 and 74 are ideally lined with non-metallic material, such as teflon, and are used to guide and retain the tray 18 in position on the cradle 14. The channels 72 and 74 are sized and shaped to receive the legs 21 and 23 of the side walls 20 and 22 on the tray 18. A support block 76 is attached to the forward wall 64 and is ideally formed out of teflon or other non-metallic material. The support block 76 aids in supporting and holding the tray 18 in the cradle 14.

A recess 78 is formed in the forward wall 64 in which is mounted sensors 80 and 82 that detect not only the presence of a tray 18 in the cradle 14, but confirm positive engagement of the tray 18 in the cradle 14. Ideally, the sensors are connected to a controller that controls operation of the apparatus 10 to prevent operation until positive engagement of the tray 18 is had with the cradle 14. For purposes of this particular application of the invention, a controller can be a human operator, robot, or electronic device, such as a computer or micro-processor that is commercially available.

To aid in guiding the cradle 14 as it rotates, a second carriage assembly 88 is pivotally mounted to the back wall 62 and slidably mounted to a second track assembly 90, which is mounted to the base 38. As the cradle 14 is rotated about its approximate center point, its center of rotation is vertically displaced to thereby provide clearance and non-interference to accommodate its non-circular shape. This rotational and translational movement maximizes the efficiency of the work space because the tray 18 is tilted almost entirely within the space it would occupy if it were not rotated at all.

Rotatably attached to the back wall 64 of the cradle 14 is a displacing assembly 92, which includes a plurality of projections 94 formed from a single piece of teflon. It is to be understood that other materials may be used, depending on the nature of the objects being stored in tray 18. In this case, teflon is a preferred material to avoid damage to the fragile semiconductor material.

Each of the projections 94 is sized and shaped to be inserted in the spaces 36 between the objects 12 stored in the slots 34 in the tray 18. The displacing assembly 92 includes suitable mounting hardware, which is commercially readily available, for rotatably mounting the assembly 92 adjacent the opening 70 in the carriage back wall 62 so that the assembly rotates about a longitudinal axis. Ideally, the mounting mechanism 96 biases the displacing assembly 92 into the undeployed or stored position shown in FIG. 5. In this stored position, the projections 94 are rotated to be recessed in the opening 70 in the back wall 62, thus enabling a tray 18 with objects 12 inserted therein to be placed in the cradle 14 without interference. In this regard, it is to be understood that the tray 18 may merely be supported by the cradle 14 or it can be positively engaged with and held by the cradle 14, such as, engaging the legs 21 and 23 with the channels 72 and 74 and the tray bottom wall 26 support block 76.

Returning to FIG. 5, the displacing assembly 92 can optionally include an array of photo-electric sensors 98 that used emitted light to detect the presence of objects 12 in the tray 18. This information is electronically communicated to the controller for use in the manufacturing process.

Figure 5:
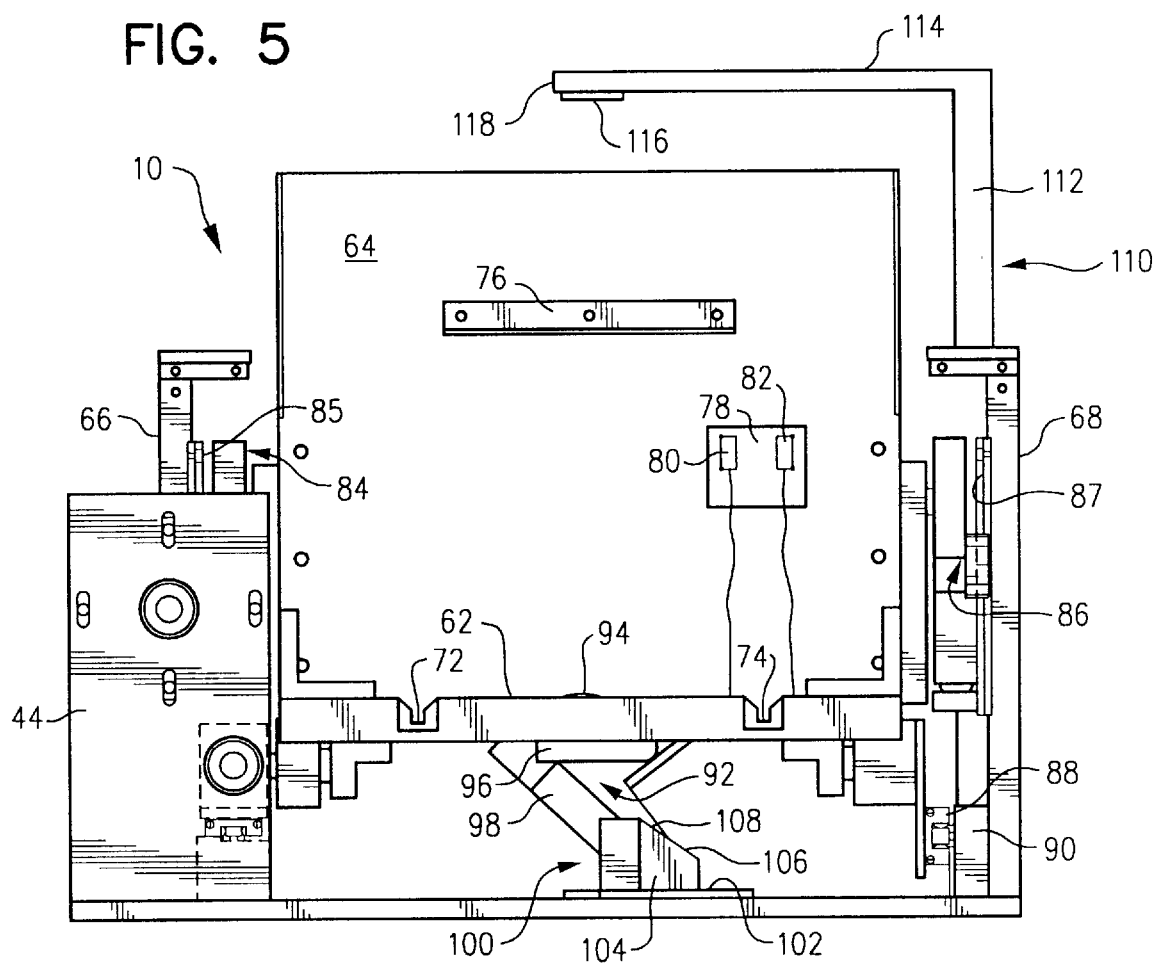
FIG. 5 is a front plan view of the apparatus of FIG. 1.

Continuing to refer to FIG. 5, a cam block 100 is shown mounted to the base 38. Ideally the cam block 100 is formed of teflon material and includes a mounting base 102 with a cam 104 formed on the top thereof. The top surface 106 of the cam 104 is inclined to slope downward towards the interior of the apparatus 10. The cam block 100 is used to urge the displacing assembly 92 to rotate into a deployed position (shown in FIG. 8) as the cradle 14 rotates from the back position (shown in FIGS. 2–5) to the forward position (shown in FIG. 8). Ideally, the displacing assembly 92 is formed of an aluminum base material, while the cam block 100 and the bearing member 108 are formed of teflon or VHMW material to reduce friction and wear.

In the preferred embodiment, the displacing assembly 92 has the bearing member 108 integrally formed with the projections 94, and it extends downward towards the base 38 when in the stored condition, as shown in FIG. 5. The bearing member 108 is sized and shaped to contact the cam block 100 and thereby force the displacing assembly 92 to rotate counter-clockwise (as shown in the front view of FIG. 5), causing the projections 94 to rotate through the opening 70 in the back wall 62. When the cradle 14 is tilted or rotated to the full forward position, the projections 94 will be fully deployed and held in position by the bearing member 108 contacting the cam block 100. The slope of the top surface 106 of the cam 104 controls the rate at which the displacing assembly 92 is deployed and stored.

It is to be understood that while a mechanical system is used to deploy the displacing assembly 92, other methods may be used as well, including electro-mechanical or fluid power transmission. In the embodiment depicted herein, the mechanical method is used to consolidate the number of components and simplify operation. Thus, in the preferred embodiment, only one prime mover or motor 48 is required to operate the apparatus 10.

Figure 6:
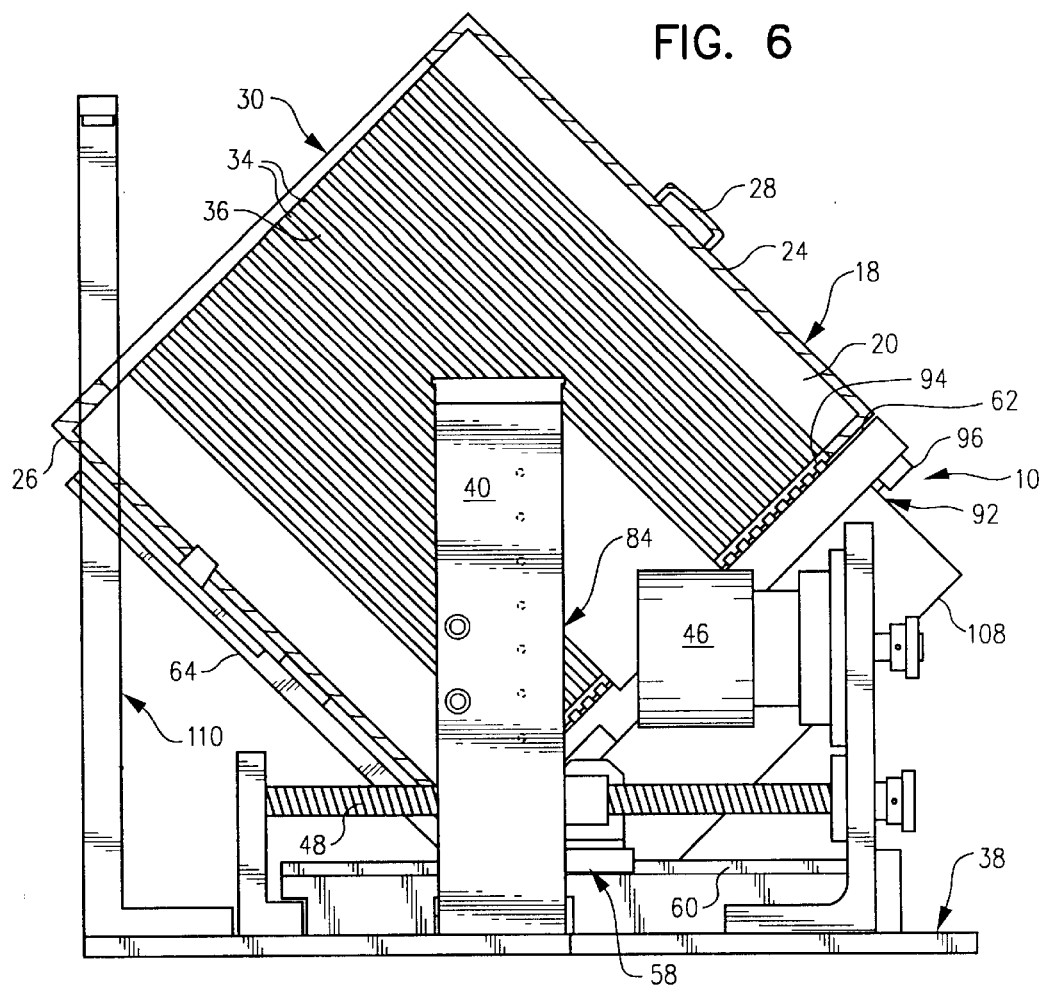
FIG. 6 is a side plan view of the apparatus formed in accordance with the present invention showing the cradle moved to an approximate 7 degree tilted back position.
Figure 7:
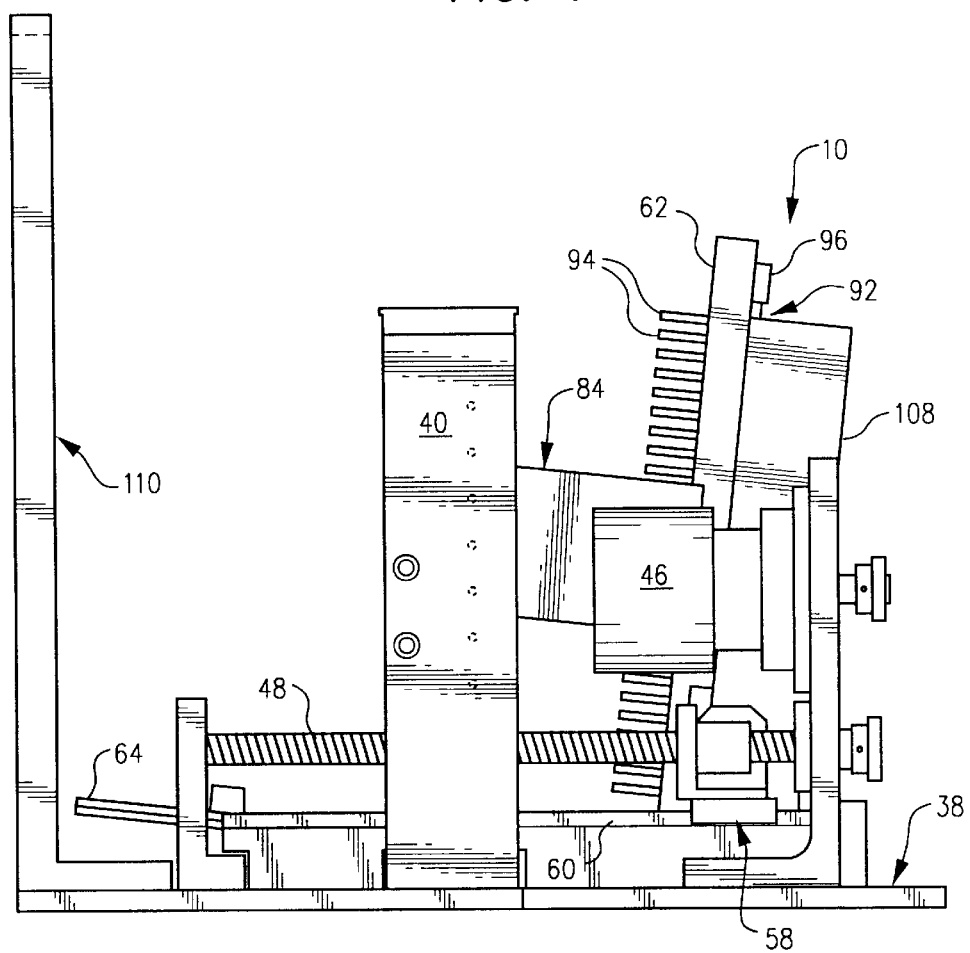
FIG. 7 is a side plan view of the apparatus formed in accordance with the present invention showing the cradle moved to a substantially 45 degree tilted back position.
Figure 8:
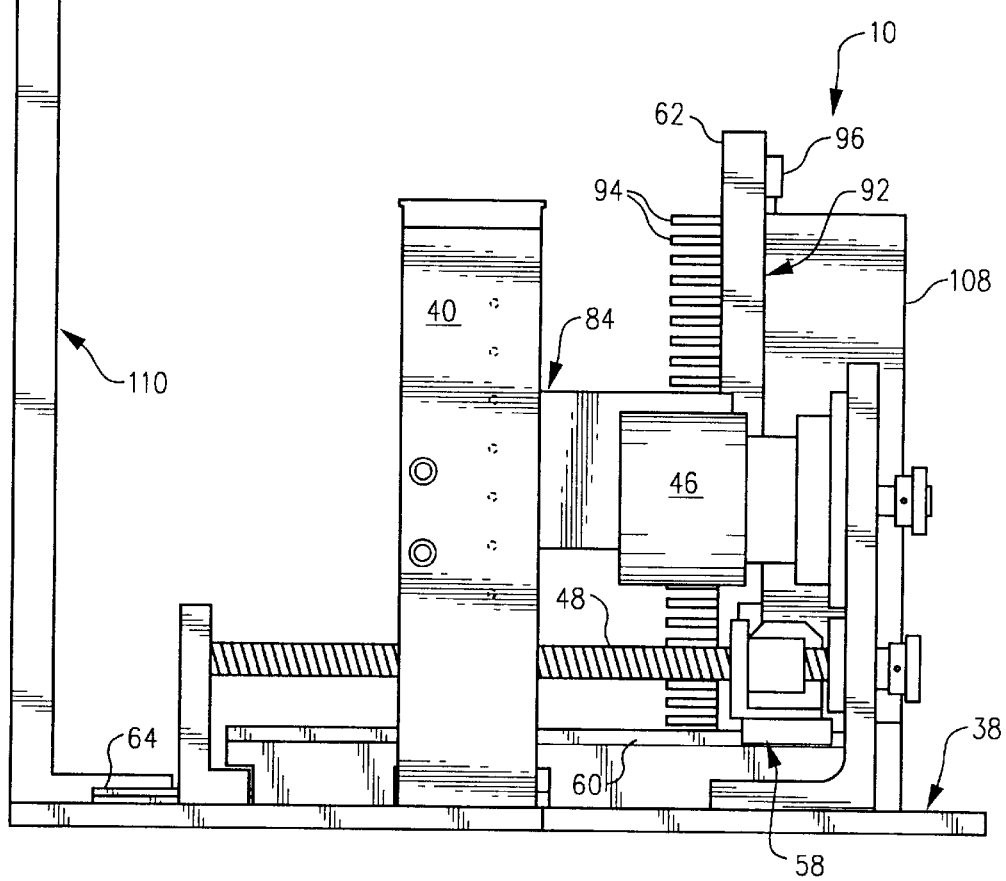
FIG. 8 is a side plan view of the apparatus formed in accordance with the present invention showing the cradle in a fully forward or substantially horizontal position.

Referring to FIGS. 3–8, also shown therein is another sensor assembly 110 having a pole 112 mounted to the base 38 and projecting substantially perpendicularly thereto to a height that extends above the cradle 14 and a tray 18 mounted therein. An arm 114 extends from the pole and includes a sensor element 116 mounted on the free end 118 at the arm 114. A second sensor element 120 is mounted to the base 38 and positioned in vertical alignment with the first sensor element 116 to permit communication of light there between. The second sensor assembly 110 is positioned such that when the cradle 14 is in the full forward position, as shown in FIG. 8, displaced cross-slotted objects in the tray 18 will break the light beam, triggering a signal to be sent to a controller.

In operation, the cradle 14 is placed in the completely tilted back position as shown in FIG. 2. A tray 18 of objects 12 is then placed in the cradle 14 so that the first opening 30 is facing upward and the second opening 32 is facing towards the back wall 62. In addition, the opening 70 in the back wall 62 will be aligned with the second opening 32 in the tray 18. As such, the object 12 will be in a vertical position.

Ideally, when the tray 18 is placed in the cradle 14, the legs 21 and 23 of the side walls 20 and 22 of the tray 18 will engage the channels 72 and 74 in the back wall 62 to provide positive alignment and engagement. In addition, the bottom wall 26 of the tray 18 will engage the support block 76 to provide further alignment and support. The support block 76 also prevents disengagement of the tray 18 from the cradle 14 when in the full forward position (shown in FIG. 8). Finally with the tray 18 so placed in the cradle 14, the sensors 80 and 82 in the recess 78 will detect the positive engagement of the tray 18 with the cradle 14, thus sending a signal to the controller that the tray 18 is properly mounted in the cradle 14.

The motor 46 is then activated (by the controller), which in turn causes the ball screw 48 to rotate. The rotating ball screw 48 drives the carriage assembly 58 to move in a direction from the second end 54 of the ball screw 48 to the first end 52 of the ball screw 48. Movement of the carriage assembly 58 results in the cradle 14 moving from the full tilted back position shown in FIGS. 2–5 to the full forward position shown in FIG. 8. As the cradle 14 moves, it tilts through a 45 degree angle, as shown in FIG. 6, and a 7 degree angle, as shown in FIG. 7. The carriage assembly 58 enables movement of the cradle 14 to any degree of tilting, ideally in the range of 0° to 90°, although a greater range may be selected, such as 0° to 100°.

Movement of the cradle 14 to the full forward position causes the bearing member 108 on the displacing assembly 92 to contact the cam block 100, forcing the assembly 92 to rotate from the stored or undeployed position shown in FIG. 5 to the fully deployed position shown in FIG. 8. As the displacing assembly 92 rotates into the deployed position, the projections 94 are rotated through the opening 70 in the back wall 64 and the second opening 32 in the tray 18 and into alignment with the spaces 36 between the slots 34. The movement of the displacing assembly 92 to the deployed condition also brings the array of photo-electric sensors 98 into alignment with the slots 34 in the tray 18 to thereby detect the presence of objects 12 in the slots 34.

A recurring problem with storing objects in slotted trays is that objects may become cross-slotted. In other words, one side of the object 12 will be inserted in one slot 34 and the other side of the object 12 will be inserted in an unmatching slot 34 such that the object 12 projects across one or more spaces 36 between the slots 34. Thus, the present invention displaces and detects the cross-slotted objects by causing the projections 94 to rotate into each space 36 and contact any cross-slotted object. As the displacing assembly 92 rotates into the fully deployed position, the projections 94 push or urge the cross-slotted objects to move a short distance out of the tray 18 through the first opening 30. The displaced cross-slotted objects can then be observed by a controller, such as an operator.

However, in accordance with the preferred method of the present invention, the displaced cross-slotted objects are electronically detected by means of photo-electric sensors. Thus, when the cradle 14 is rotated to the full forward position, the cross-slotted objects will be displaced into the beam of light generated by the sensor assembly 110 to thereby block the light and cause a signal to be generated to the controller. The controller can then correct the situation as appropriate under the circumstances. In other words, the controller can cause an operator to physically remove the cross-slotted object. Alternatively, a robotic arm or an electronic device can be used to remove the cross-slotted object and, preferably, place the cross-slotted object in the proper slots on the tray 18.

While a preferred embodiment of the invention has been illustrated and described, it is to be understood that various changes can be made therein without departing from the spirit and scope thereof. For instance, as described above, the mechanical system for deploying the displacing assembly 92 can be replaced with an electronic actuator assembly. As such, an electric or fluid power device would be used with the mounting assembly 96 to rotate the displacing assembly 92 into and out of the deployed position. Additionally, the displacing assembly 92 could be actuated to move into the deployed position when the cradle is in the fully tilted back position or at any position between the deployed and stored positions. In addition, the array of photo-electric sensors 98 on the displacing assembly 92 can be removed for simplification and cost efficiency. Similarly, the sensor elements 80 and 82 can likewise be removed without substantially affecting the operation of the invention. Thus, the invention is to be limited only by the scope of the claims that follow.

We claim:

1. An apparatus for displacing cross-slotted objects in a tray, the tray having a plurality of slots separated by spaces, each slot sized and shaped to receive a substantially planar-shaped object, the tray further including a first opening sized to allow insertion of the objects into the slots and removal of the objects therefrom, and a second opening sized and shaped to permit access to the spaces between the slots, the apparatus comprising:

means for supporting the tray;

means for displacing one or more cross-slotted objects in the tray, the displacing means comprising at least one projection sized and shaped to be at least partially inserted into at least one of the spaces between the slots through the second opening; and means for moving said displacing means into and out of the at least one of the spaces between the slots whereby said displacing means pushes a cross-slotted object disposed in the at least one of the spaces between the slots at least partially out of the tray through the first opening.

2. The apparatus of claim 1 wherein said displacing means comprises a plurality of projections, each projection being aligned with a single space between a pair of slots.

3. The apparatus of claim 1, furthering comprising a means for tilting said supporting means between a substantially horizontal position and a substantially inclined position.

4. The apparatus of claim 3, wherein said moving means cooperates with said supporting means such that said displacing means displaces cross-slotted objects as said supporting means and the tray are moved from the substantially inclined position to the substantially horizontal position.

5. An apparatus for detecting cross-slotted objects in a tray, the tray having a plurality of slots separated by spaces, each slot being sized and shaped to slidably receive a substantially planar-shaped object, the tray further including a first opening sized and shaped to allow insertion of objects into the slots and removal of objects therefrom by a controller, and a second opening sized and shaped to permit access to each space between each pair of slots, the apparatus comprising:

means for holding the tray;

means for displacing cross-slotted objects projecting across spaces between slots in the tray, said displacing means comprising at least one projection sized and shaped to be at least partially inserted into the space between each pair of slots through the second opening;

means for moving said displacing means into the space between each pair of slots to push cross-slotted objects disposed in the spaces between the slots so as to at least partially displace them out of the tray through the first opening; and means for detecting the displaced cross-slotted objects.

6. The apparatus of claim 5, wherein said displacing means comprises a plurality of projections positioned adjacent to the second opening in the tray when the tray is held on said holding means, and further wherein each projection is aligned with a space between a pair of slots.

7. The apparatus of claim 6, further comprising means for notifying the controller of displaced cross-slotted objects.

8. The apparatus of claim 6, further comprising means for tilting said holding means to thereby move the tray between a substantially horizontal position and a substantially inclined position.

9. The apparatus of claim 8, wherein said moving means cooperates with said supporting means to move said displacing means as said tilting means tilts said holding means.

10. The apparatus of claim 9, further comprising means for positively engaging the tray with said holding means for detecting positive engagement of the tray with said holding means.

11. The apparatus of claim 10, wherein said engagement detecting means is coupled to said tilting means and said moving means to disable operation of the apparatus when positive engagement of the tray with said holding means is not detected and to enable operation of the apparatus when positive engagement is detected.

12. An apparatus for detecting cross-slotted objects in a tray having a plurality of slots for receiving objects, each pair of slots being separated by a space, the tray including a first opening sized and shaped to allow insertion of object into the slots and removal therefrom by a controller, sand a second opening sized and shaped to enable access to each of the spaces between the slots, the apparatus comprising:

a cradle for holding the tray;

means for tilting said cradle between a substantially horizontal position and a substantially inclined position;

means for displacing cross-slotted objects at least partially out of the first opening in the tray as said tilting means tilts said cradle and the tray to the substantially horizontal position; and means for detecting displaced cross-slotted objects.

13. The apparatus of claim 12, wherein said detecting means further comprises means for notifying the controller of the displaced cross-slotted objects.

14. The apparatus of claim 12, further including a base member upon which said cradle is rotatably mounted; and further wherein said displacing means cooperates with said base member as said tilting means tilts said cradle to move said displacing means from a stored position to a deployed position.

15. The apparatus of claim 14, further comprising a cam member mounted on said base and positioned such that said displacing means contacts said cam member as said tilting means tilts said cradle to the substantially inclined position to thereby move said displacing means to the deployed position.

16. The apparatus of claim 12, wherein said tilting means comprises an actuator, and a tilting assembly coupled to said cradle and a stationary frame, said tilting assembly configured for simultaneous rotational and translational movement whereby said cradle rotates about a rotational axis without substantial overall movement of said cradle in a vertical, horizontal, or lateral direction.

17. A method for detecting cross-slotted objects in a tray formed with side-by-side pairs of aligned slots, each pair of aligned slots for receiving a properly held object, and wherein a cross-slotted object is an object improperly held in non-aligned slots, the method comprising displacing ends of the cross-slotted objects at least partially out of the tray by first causing projections to be at least partially inserted into spaces between said aligned slots; and thereafter electronically detecting the ends of the displaced cross-slotted objects; and notifying a controller of the detected ends of the displaced cross-slotted objects.

18. A method for detecting cross-slotted objects in a tray formed with pairs of side-by-side aligned slots, each pair of aligned slots for receiving a properly held object, and wherein a cross-slotted object is an object improperly held in non-aligned slots, comprising the steps of:

tilting the tray from a substantially inclined position to a substantially horizontal position;

mechanically displacing cross-slotted objects to a project at least partially out of the tray as the tray is tilted to the substantially horizontal position; and electronically detecting the displaced cross-slotted objects in the tray.

\* \* \* \* \*